United States Patent [19]
Dumont

[11] Patent Number: 6,140,858
[45] Date of Patent: Oct. 31, 2000

[54] PREDISTORTION CIRCUIT FOR AN ANALOG SIGNAL IN A VIDEO COMMUNICATION NETWORK

[75] Inventor: François Dumont, Etiolles, France

[73] Assignee: U.S. Philips Corporation, New York, N.Y.

[21] Appl. No.: 08/952,273

[22] PCT Filed: Mar. 19, 1997

[86] PCT No.: PCT/IB97/00270

§ 371 Date: Nov. 18, 1997

§ 102(e) Date: Nov. 18, 1997

[87] PCT Pub. No.: WO97/35390

PCT Pub. Date: Sep. 25, 1997

[30] Foreign Application Priority Data

Mar. 20, 1996 [FR] France ................................. 96 03453

[51] Int. Cl.$^7$ ............................................ H03K 5/08
[52] U.S. Cl. ..................... 327/317; 327/310; 327/329; 327/551; 330/149
[58] Field of Search ................................ 327/309, 310, 327/317, 318–321, 329, 551; 330/305, 306, 149

[56] References Cited

U.S. PATENT DOCUMENTS

| | | | |
|---|---|---|---|
| 5,321,710 | 6/1994 | Cornish et al. | 372/26 |
| 5,589,797 | 12/1996 | Gans et al. | 330/149 |
| 5,600,472 | 2/1997 | Uesaka | 330/149 |
| 5,854,811 | 12/1998 | Sasaki | 375/296 |
| 5,969,575 | 10/1999 | Helms | 330/294 |

FOREIGN PATENT DOCUMENTS

| | | |
|---|---|---|
| 0498456A1 | 8/1992 | European Pat. Off. . |
| 9310603A1 | 5/1993 | WIPO . |

OTHER PUBLICATIONS

Bertelsmeier et al, "Linearization of Broadband Optical Transmission Systems by Adaptive Predistortion", pp. 206–212, Sep. 1984.

*Primary Examiner*—Kenneth B. Wells
*Attorney, Agent, or Firm*—Daniel J. Piotrowski

[57] ABSTRACT

The invention relates to a predistortion circuit for an analog signal in a video communication network. In one embodiment the circuit according to the invention includes a primary branch connecting an input to an output, a delay circuit for delaying a signal in the primary branch, a first coupler/shunting device which samples a fraction of the input signal, a secondary branch connected to the shunting output of the coupler/shunting device, the secondary branch including a second-harmonic generator, and a second coupler/shunting device which receives the output signal from the secondary branch and adds it to the signal at the output of the primary branch. The circuit according to the invention makes possible a symmetrical filter with improved performance characteristics and low manufacturing cost.

9 Claims, 2 Drawing Sheets

PREDISTORTION CIRCUIT FOR AN ANALOG SIGNAL IN A VIDEO COMMUNICATION NETWORK

FIELD OF THE INVENTION

The present invention relates to a predistortion circuit comprising a branch called primary branch connecting an input to an output, a delay circuit for delaying the signal in the primary branch, a coupler/shunting device which samples a fraction of the input signal, a branch called secondary branch connected to the shunting output of the coupler/shunting device, comprising a second-harmonic generator, a coupler/shunting device which receives the output signal of the secondary branch and adds this signal to the signal on the output of the primary branch.

The invention is applied to video communication networks which utilize analog television signals, more particularly, but not of necessity in transmitters transmitting a signal via an optical fiber. Certain components of such transmitters, for example, laser diodes, have an insufficient linearity for transmitting analog signals in the multiplex mode; therefore, a "predistortion" is introduced in the signal, that is to say, a signal having an amplitude which is as much as possible equal to that of the distortion caused by the component, but of opposite direction, by means of a distortion generator which comprises, for example, a second-harmonic generator mentioned above.

BACKGROUND OF THE INVENTION

A predistortion circuit is known from the document "Linearization of broadband optical transmission systems by adaptive predistortion", by M. Berstelmeier and W. Zschunke in FREQUENZ, Vol. 38 (1984), no. 9, pages 206–212. The predistortion technique used according to this document permits of obtaining interesting performance, but in a relatively small frequency range.

SUMMARY OF THE INVENTION

It is an object of the invention to permit the use of filters for increasing the range of frequencies used, without enhancing the manufacturing complexity too much.

For this purpose, the second-harmonic generator is formed by a divider/phase shifter producing two anti-phase signals on two first connections, two pairs of cascaded diodes, each of them being connected between the two first connections, the diodes of the first pair being interconnected by their cathodes and those of the other pair being interconnected by their anodes, means for biasing the four diodes in forward direction, two second connections connected respectively to the node of the two cathodes and to the node of the two anodes, which form a symmetrical output.

The invention is thus based on the idea of using a symmetrical arrangement from the input of the harmonic generator onwards, for improving the performance thereof while providing a symmetrical output which makes the introduction of a symmetrical filter possible without additional cost. In addition, the spectral purity of the second-harmonic signal is better. A further advantage results from the following fact: the direction of the required correction is unknown beforehand, and thus the polarity necessary for the correction signal is unknown. An inverter circuit is thus habitually provided in the chain of the correction elements. Because of the symmetrical structure of the harmonic generators, such an inverter is no longer necessary because it is sufficient to cross the connections, if required.

Advantageously, the circuit comprises in a cascade combination with the second-harmonic generator, a symmetrical type of filter whose symmetrical input is connected to the second connections.

Thus, the frequency range in which the correction is effective is thus increased in a simple manner while the symmetrical drive of the filter on the output of the second-harmonic generator is possible without adding an additional symmetrizing circuit.

Preferably, the circuit comprises a second coupler/shunting device which samples a signal fraction, a second secondary branch connected to the shunting output of the second coupler/shunting device, comprising a third-harmonic generator which includes a divider/phase shifter producing on two third connections two anti-phase signals, two diode assemblies, each assembly comprising two series-arranged diodes conductive in the same direction, the first assembly being connected by its two ends to one of the third connections, the second assembly being connected by its two ends to the other third connection, means for biasing the four diodes in forward direction, two fourth connections which formal symmetrical output, connected respectively to the node of the two diodes of the first assembly and to the node of the two diodes of the second assembly, a coupler/shunting device which receives the output signal of the second secondary branch and adds the output signal to the output signal of the primary branch.

The same principle as for the second-harmonic generator is applied with the same advantages to a third-harmonic generator. The spectral purity of the third-harmonic signal is better, the signal containing fewer even harmonics.

The circuit preferably comprises, in a cascade arrangement with the third-harmonic generator, a symmetrical type of filter whose symmetrical input is connected to the fourth connections.

Thus, the frequency range in which the correction is effective is further increased in a simple manner, the symmetrical drive of the filter on the output of the third-harmonic generator being possible without adding an additional symmetrizing circuit.

Advantageously, the circuit comprises, connected to the output of the second-harmonic generator, a second second-harmonic generator containing at least a second pair of cascaded diodes, for generating a fourth-harmonic signal.

In this manner it is possible to generate a fourth-harmonic correction signal in a simple manner.

Preferably, the signal comprises means for making the current in the diodes vary as a function of the ambient temperature.

Thus, the correction circuit can produce a correction signal whose amplitude remains constant as a function of the ambient temperature.

Furthermore, the circuit advantageously comprises a delay line which has a variable delay as a function of the ambient temperature.

Thus, the correction circuit can produce a correction signal whose phase, relative to that of the signal to be corrected, continues to be constant as a function of the ambient temperature.

To realize the variable delay, a variable capacitance diode fed via a resistance bridge of which at least one resistor has a value that depends on the ambient temperature is advantageously additionally connected in parallel with the delay line.

A video communication network advantageously comprises a predistortion circuit according to the invention.

These and other aspects of the invention will be apparent from and elucidated with reference to the embodiments described hereinafter.

DESCRIPTION OF PREFERRED EMBODIMENTS

Figure 1:
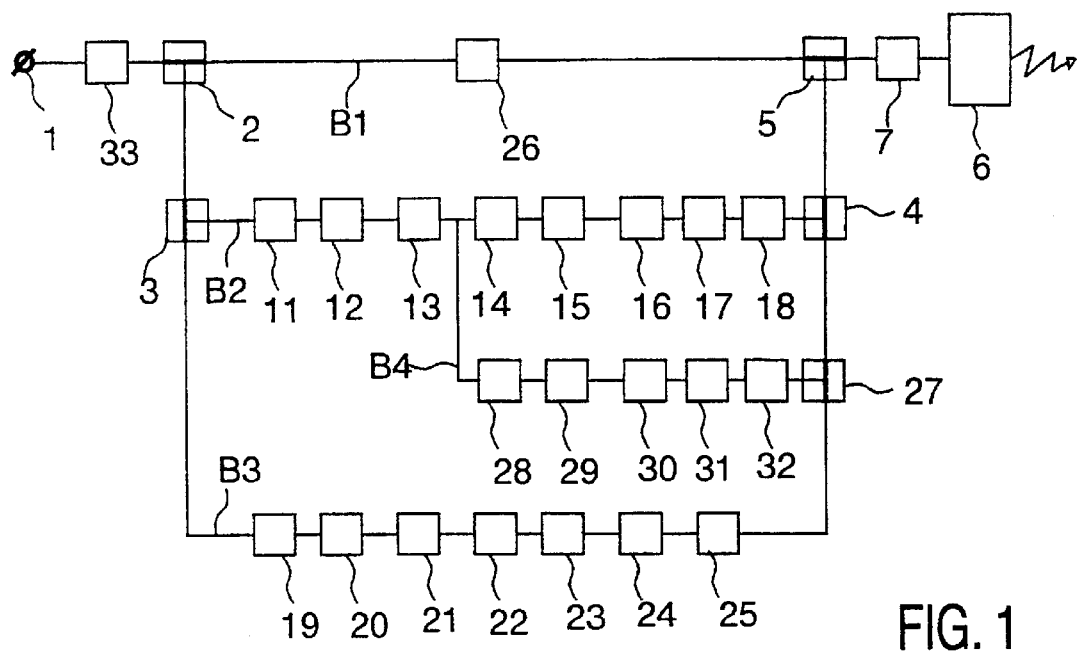
FIG. 1 diagrammatically shows an electric signal predistortion circuit producing a signal which has one transmission component.

The predistortion circuit shown in FIG. 1 comprises a branch called primary branch connecting via a conductor B1 an input 1 to an output which is formed by a transmission component which is here, by way of non-limiting example, an electro-optical converter 6, but which could be any other imperfect linearity component.

This primary branch has a delay element of the signal 26, for example, a delay line, and an impedance adapter 7, known per se, located at the input of the electro-optical converter, and an amplifier 33 known per se located near to the entry if this is necessary for reaching a sufficient level for the electro-optical converter 6.

This branch comprises a coupler/shunting device 2 for sampling a small fraction of the input signal, and a coupler/shunting device 5 for adding a signal in the primary branch.

A first secondary branch connects via a conductor B2 the shunting output of the coupler/shunting device 2 to an input of the coupler/shunting device 5.

At B2 are arranged a coupler/shunting device 3 for sampling a fraction of the signal, and a coupler/shunting device 4 for adding a signal. A second secondary branch connects via a conductor B3 the shunting Output of the coupler/shunting device 3 to an input of the coupler/shunting device 4.

Alternatively, in equivalent fashion, a part of the signal which signal is meant for branch B3 could also be tapped directly from the primary branch, that is to say, that the coupler/shunting devices 3 and 4 could be placed on the conductor B1.

The delay line 26 of the primary branch makes it possible to compensate for the minimum transit time of the signal in the correction signal generating branches.

The branches B2 and B3 comprise each:

a filter, 11 or 19 respectively, an amplifier, 12 or 20 respectively, in the branch B2, a second-harmonic generator 13 and in the branch B3 a third-harmonic generator 21, an all-pass filter 14 or 22 respectively, which provides a phase shift as a function of the frequency so as to increase the frequency range in which the correction provided by the branches B2 and B3 has a suitable phase relative to the signal on the output of the primary branch, a frequency filter 15 or 23 respectively, which imposes a variable attenuation on the signal which attenuation varies with frequency so as to increase the frequency range in which the correction provided by the branches B2 and B3 has an adequate amplitude, a gain adjustment circuit 16 or 24 respectively, allowing of regulating the amplitude of the correction signal, a delay circuit 17 or 25 respectively, for example, a delay line. The length of each line is adjusted to have the predistortion signals exactly in phase opposition to the distortion produced by the electro-optical converter. The branch B2 additionally comprises here an amplifier 18.

The order in which the modules 14 to 18 or 22 to 25 are disposed is unimportant. The same holds for the modules 11 to 13, or 19 to 21.

In the case where the input signal presents a multiplex of various signals having different frequencies, as is the case in a video communication network, the distortion signals obtained on the output of the branches B2, B3 have not only the squares and cubes of the input signals, but also their intermodulation products.

A third secondary branch connects via a conductor B4 the output of the second-harmonic generator 13 to a coupler/shunting device 27 situated in branch B3, and comprises a second second-harmonic generator 28 which is similar to the second-harmonic generator 13. As this second second-harmonic generator is connected in cascade with the first second-harmonic generator, it produces a fourth-harmonic signal on the output. The modules 29 to 32 are similar to the respective modules 14 to 17 or 22 to 25.

Thus, by adding second, third and fourth-harmonic terms, one determines in a way the distortion by means of a Taylor series development, limited to the fourth degree term. If less good performance suffices, it is possible to take away the fourth-harmonic generator branch and even that of the third-harmonic generator.

Figure 2:
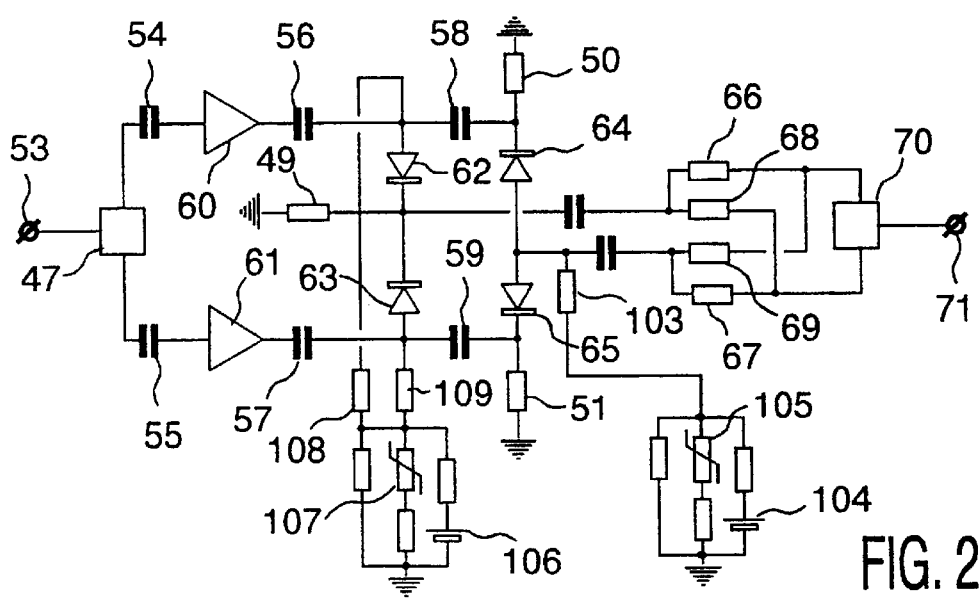
FIG. 2 is a diagram of the second-harmonic generator of a circuit according to the invention, followed by a symmetrical filter.

The second-harmonic generator represented by FIG. 2 comprises, starting from an input 53, a power divider 47 which divides the incoming signal into two signals having practically equal power, phase shifted substantially by 180° with respect to each other. By way of non-limiting example, this divider can be formed by a wideband transformer used as a symmetrical/dissymmetrical converter. The signals coming from the power divider are transmitted to the amplifiers 60 and 61 via coupling capacitors 54 and 55. The amplified signals are transmitted by the coupling capacitors 56 and 57 and 58 and 59 to an assembly of four rectifier diodes 62 to 65, arranged in pairs. The pair formed by the diodes 62 and 63, connected by their cathodes, is biased in the forward direction by the resistors 108, 109 connected to a voltage source 106, and a resistor 49 connecting to ground.

One could also bias the diodes, for example, from a negative source inserted between ground and the resistor 49. The pair formed by the diodes 64 and 65, connected by their anodes, is biased in forward direction by a resistor 103 connected to a voltage source 104, and resistors 50 and 51 connecting to ground. The bias current is to be adjusted experimentally to obtain the best passband.

Figure 3:
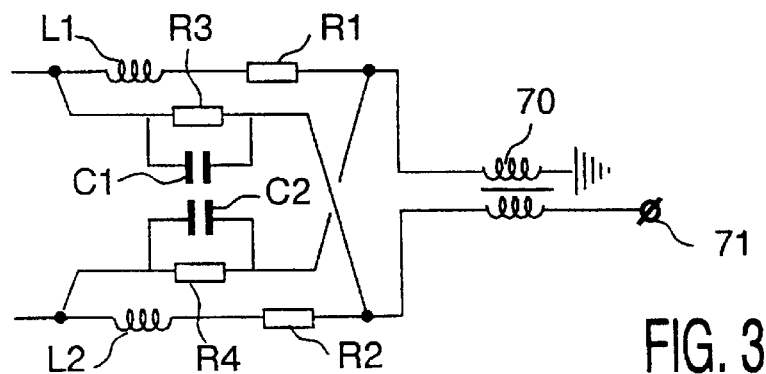
FIG. 3 is a diagram of a filter used in the circuit shown in FIG. 2.

The diodes 62 and 63 receive equal, but anti-phase signals on their anodes, and produce on their cathodes signals which are proportional to the square of the signal present on the input 53. Similarly, the diodes 64 and 65 receive equal, but anti-phase signals on their cathodes, and produce on their anodes signals which are proportional to the square of the signal present on the input 53, in phase opposition to those produced by the diodes 62–63. The second-harmonic signals present on the node of the diodes 62–63 and the node of the diodes 64–65 are taken by linking capacitors to a symmetrical trellis filter which comprises the direct-path elements 66 and 67, and the crossed path elements 68 and 69, followed by a symmetrizer 70 which produces a signal on an output 71. These elements are explained in more detail by FIG. 3. A trellis filter known per se is shown there. It comprises:

two direct branches comprising each, for forming the elements 66 and 67 of FIG. 2, an inductor L1, L2 respectively in a series combination with a resistor R1, R2 respectively, two crossed branches comprising each, for forming the elements 68, 69 of FIG. 2, a resistor R3, R4 respectively, combined in parallel with a capacitor C1, C2, respectively.

The input is symmetrical whereas the output is dissymmetrical via terminal 71 due to the symmetrizer 70 formed here by a transformer known per se. The symmetrical structure of the harmonic generators allows of directly driving this filter without an intermediate component. The circuit of FIG. 2 corresponds to the combination of the modules 13 and 14 in FIG. 1.

The generator 28 of FIG. 1, similar to the second-harmonic generator 13, and which generates a fourth-harmonic signal, is formed in identical fashion to the part of FIG. 2 which comprises the capacitors 56 to 59 and the diodes 62 to 65, with the corresponding current supplies. The input capacitor of the second generator 28, which is identical to the capacitor 56 of the first generator 13, is connected to the node of the diodes 62–63 of the first generator 13 and the input capacitor of the second generator 28, which is identical to the capacitor 57 of the first generator 13, is connected to the node of the diodes 64–65 of the first generator 13. At the end of this arrangement is inserted a filter 29 which is similar to filter 14 and consequently comprises elements identical to 66 to 71 of FIG. 2. There too, a symmetrizer is omitted, the generator 28 receiving symmetrical signals coming from the generator 13. According to a simplified variant in which the filter 29 would be omitted, the generator 28 could be formed in identical manner to the part of FIG. 2 comprising only the capacitors 56, 57 and the diodes 62, 63 with the corresponding current supply. A dissymmetrical output signal could be tapped from the node of the diodes and applied to the filter 30.

Figure 4:
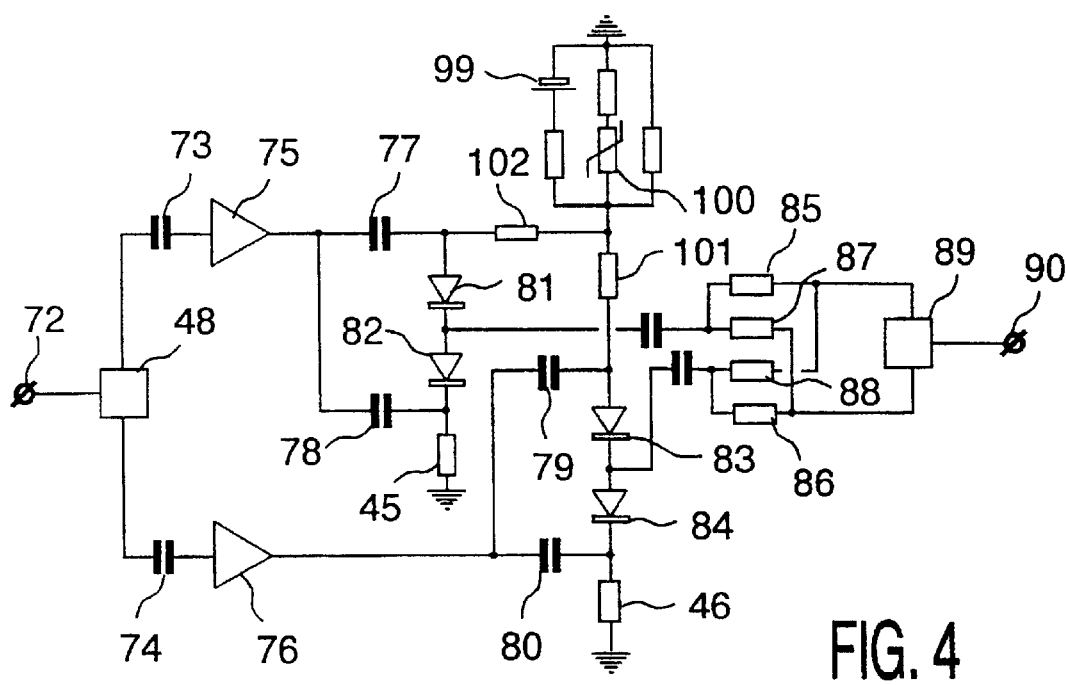
FIG. 4 is a diagram of a third-harmonic generator of a circuit according to the invention, followed by a symmetrical filter.

The third-harmonic generator represented by FIG. 4, has not only an input 72, a power divider 48, identical to the divider 47 mentioned earlier, which divides the incoming signal into two signals having practically the same power, substantially phase shifted by 180°. The signals coming from the power divider 48 are transmitted to the amplifiers 75 and 76 via coupling capacitors 73 and 74. The amplified signals are transmitted by the coupling capacitors 77 and 78 and 79 and 80 to an assembly of four rectifying diodes 81 to 84 arranged in pairs. The pair formed by the diodes 81 and 82 in a series combination, having the same direction of conduction, is biased in forward direction by a resistor 102 which is connected to a voltage source 99, and a resistor 45 which is connected to ground. The pair formed by the series-arranged diodes 83 and 84 which have the same direction of conduction is biased in forward direction by a resistor 101 which is connected to the same voltage source 99 and a resistor 46 which is connected to ground. The diodes could, for example, also be biased from a negative voltage source inserted between ground and the resistors 45 and 46. The bias current is to be adjusted experimentally so as to obtain the best passband.

At the node of each diode pair 81–82 or 83–84, a signal is obtained formed by the sum of a component which is proportional to the signal on the input 72 and a component which is proportional to the cube of the signal. The component proportional to the input signal, albeit undesired, does not cause an annoying effect on the signal finally transmitted by the electro-optical converter 6; however, it may be suppressed by optionally inserting a capacitor between the output of the amplifier 75 and the node of the diodes 83–84 in a manner not shown, and a capacitor between the output of the amplifier 76 and the node between the diodes 81–82. The third-harmonic signals present on the node of the diodes 81–82 and on the node of the diodes 83–84, which are in phase opposition to each other, are taken by capacitive links to a symmetrical trellis filter which comprises the direct path elements 85 and 86, and the crossed path elements 87 and 88, followed by a symmetrizer 89 which produces a signal on an Output 90. These elements are similar to those described above with reference to FIG. 3. The circuit of FIG. 4 corresponds to the combination of modules 21 and 22 in FIG. 1.

The electro-optical converter is generally mounted in a housing which is stabilized relative to the ambient temperature. The distortion it produces thus does not depend on the ambient temperature. On the contrary, the correction signal produced by the branches B2, B3, B4 has a tendency to drift as a function of the ambient temperature, owing to the drift of the gain of the amplifiers and the thermal drift of the diodes. The signal is thus to be corrected for thermal drift; therefore, the bias current of the diodes is made to vary with the ambient temperature, because the amplitude of the generated correction signals depends both on the temperature of the diodes and on their bias current. This is realized by rendering the voltage sources variable as a function of the ambient temperature by means of compensation elements added to the voltage sources:

to source 106 of FIG. 2, a resistor network comprising a resistor 107 which has a high temperature coefficient, called thermistor, to source 104 of FIG. 2, a resistor network comprising a thermistor 105, to source 99 of FIG. 4, that is, a resistor network comprising a thermistor 100.

Figure 5:
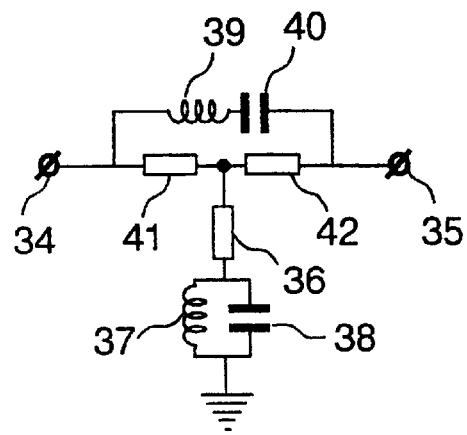
FIG. 5 is a diagram of a filter used in the predistortion circuit shown in FIG. 1.

The filter of FIG. 5 is an example of a frequency filter used at 11 and 15, at 19 and 23, and at 30 in the diagram of FIG. 1. It is a bridged T filter known per se. The stem of T comprises a series combination of a resistor 36 and an anti-resonant circuit formed by an inductor 37 and a capacitor 38. The bar of the T comprises a series combination of two resistors 41 and 42. The bridge comprises a series combination of an inductor 39 and a capacitor 40.

Figure 6:
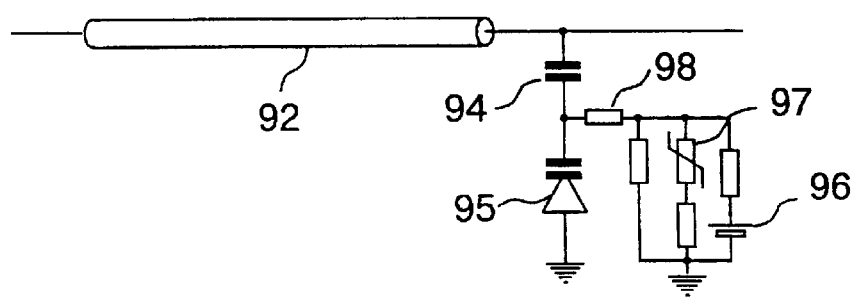
FIG. 6 is a diagram of a variable delay line used in the predistortion circuit shown in FIG. 1.

For delay lines inserted into the correction signal generating branches to bring the predistortion signals exactly in phase opposition to this distortion produced by the electro-optical converter with any ambient temperature, variable delay lines are used which vary as a function of the ambient temperature. FIG. 6 illustrates such a line. The delay line as such is referenced 92, its delay may be slightly modified by connecting a capacitor having a low capacitance in parallel with the input, with the output or with the two. This capacitor is formed by a variable capacitance diode 95, called varicap. It is connected to the delay line, here to its output, by a linking capacitor 94. It is biased in the forward direction by a voltage source 96 and a resistor network comprising a thermistor 97. Thus, the capacitance of diode 95 varies with the ambient temperature.

The digital values of the components used can be determined by a person of ordinary skill in the art on the basis of a series of measurements of the distortion to be corrected for various frequencies and for various ambient temperatures. Notably, on the basis of the optimum voltage of the voltage sources 99, 104, 106 determined for various ambient temperatures, a person of ordinary skill in the art knows how to determine the arrangement and the digital values of the corresponding compensation networks.

What is claimed is:

1. A predistortion circuit of an electric signal, comprising
    a branch called primary branch connecting an input to an output,
    a delay circuit for delaying the signal in the primary branch,
    a coupler/shunting device which samples a fraction of the input signal,
    a branch called secondary branch connected to the shunting output of the coupler/shunting device, comprising a second-harmonic generator,
    a coupler/shunting device which receives the output signal of the secondary branch and adds this signal to the signal on the output of the primary branch, characterized in that the second-harmonic generator is formed by
        a divider/phase shifter producing two anti-phase signals on two first connections,
        two pairs of cascaded diodes, each of them being connected between the two first connections, the diodes of the first pair being interconnected by their cathodes and those of tile other pair being interconnected by their anodes,
        means for biasing the four diodes in forward direction,
        two second connections connected respectively to the node of the two cathodes and to the node of the two anodes, which form a symmetrical output.

2. A predistortion circuit as claimed in claim 1, characterized in that it comprises in a cascade combination with the second-harmonic generator, a symmetrical type of filter whose symmetrical input is connected to the second connections.

3. A predistortion circuit as claimed in claim 1, characterized in that the circuit comprises:
    a second coupler/shunting device which samples a signal fraction,
    a second secondary branch connected to the shunting output of the second coupler/shunting device, comprising a third-harmonic generator which includes
        a divider/phase shifter producing on two third connections two anti-phase signals,
        two diode assemblies, each assembly comprising two series-arranged diodes conductive in the same direction, the first assembly being connected by its two ends to one of the third connections, the second assembly being connected by its two ends to the other third connection,
        means for biasing the four diodes in forward direction,
        two fourth connections which form a symmetrical output, connected respectively to the node of the two diodes of the first assembly and to the node of the two diodes of the second assembly,
    a coupler/shunting device which receives the output signal of the second secondary branch and adds the output signal to the output signal of the primary branch.

4. A predistortion circuit as claimed in claim 2, characterized in that it comprises in a cascade combination with the third-harmonic generator, a symmetrical type of filter whose symmetrical input is connected to the fourth connections.

5. A predistortion circuit as claimed in claim 1, characterized in that it comprises, connected to the output of the second-harmonic generator, a generator which is similar to the second-harmonic generator, containing at least a second pair of cascaded diodes, for generating a fourth-harmonic signal.

6. A predistortion circuit as claimed in any one of the claims 1 to 5, characterized in that it comprises means for varying the current in the diodes as a function of the ambient temperature.

7. A predistortion circuit as claimed in any one of the claims 1 to 6, characterized in that it comprises a delay line which has a variable delay as a function of the ambient temperature.

8. A predistortion circuit as claimed in claim 7, characterized in that, for realizing the variable delay, a variable capacitance diode fed via a resistance bridge of which at least one resistor has a value that depends on the ambient temperature is connected in parallel with the delay line.

9. A video communication network, characterized in that it comprises a predistortion circuit as claimed in any one of the claims 1 to 8.

* * * * *